(12) United States Patent
Sutardja (10) Patent No.: US 8,159,308 B1
(45) Date of Patent: Apr. 17, 2012

(54) LOW POWER VOLTAGE CONTROLLED OSCILLATOR (VCO)

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/763,027

(22) Filed: Apr. 19, 2010

Related U.S. Application Data (60) Provisional application No. 61/170,958, filed on Apr. 20, 2009.

(51) Int. Cl.
*H03B 5/18* (2006.01)
(52) U.S. Cl. .................................. 331/117 FE; 331/185
(58) Field of Classification Search ............ 331/117 FE, 331/117 R, 167, 185
See application file for complete search history.

(56) References Cited

U.S. PATENT DOCUMENTS

| | | | | |
|---|---|---|---|---|
| 4,918,406 A * | 4/1990 | Baumbach et al. | ....... | 331/117 R |
| 6,064,277 A * | 5/2000 | Gilbert | ...................... | 331/117 R |
| 6,469,587 B2 * | 10/2002 | Scoggins | ................... | 331/117 R |
| 6,680,655 B2 * | 1/2004 | Rogers | ........................... | 331/109 |
| 6,731,182 B2 * | 5/2004 | Sakurai | ....................... | 331/177 V |
| 6,765,448 B2 * | 7/2004 | Wu et al. | .................. | 331/117 FE |
| 6,781,471 B2 * | 8/2004 | Huang | ........................ | 331/117 R |
| 6,882,237 B2 * | 4/2005 | Singh et al. | .................... | 331/185 |

OTHER PUBLICATIONS

Andrea Mazzanti, "Class-C Harmonic CMOS VCOs, With a General Result on Phase Noise", IEEE Journal of Solid-State Circuits, vol. 43, No. 12, Dec. 2008.

* cited by examiner

*Primary Examiner* — Levi Gannon (57) ABSTRACT

An apparatus includes a tank circuit of a voltage controlled oscillator (VCO). A pair of alternating current (AC) coupling capacitors couple the gates of the pair of transistors to the drains of the pair of transistors. A bias circuit is coupled to the gates of the pair of transistors to bias the pair of transistors such that the pair of transistors alternatingly turn on during a plurality of peaks of an oscillating signal of the tank circuit and the pair of transistors turn off during a plurality of crossing points of the oscillating signal. A feedback loop may be configured to detect a peak oscillating amplitude of the oscillating signal and adjust a bias voltage of the bias circuit. Also, a supply capacitor may be coupled to the tank circuit and to the pair of transistors to provide an instantaneous current to the VCO.

13 Claims, 9 Drawing Sheets

LOW POWER VOLTAGE CONTROLLED OSCILLATOR (VCO)

CROSS REFERENCE TO RELATED APPLICATIONS

The present disclosure claims priority to U.S. Provisional App. No. 61/170,958 for "Low Power VCO Structure" filed Apr. 20, 2009, the contents of which is incorporated herein by reference in their entirety.

BACKGROUND

Particular embodiments generally relate to voltage controlled oscillators (VCOs).

Unless otherwise indicated herein, the approaches described in this section are not prior art to the claims in this application and are not admitted to be prior art by inclusion in this section.

Figure 1:
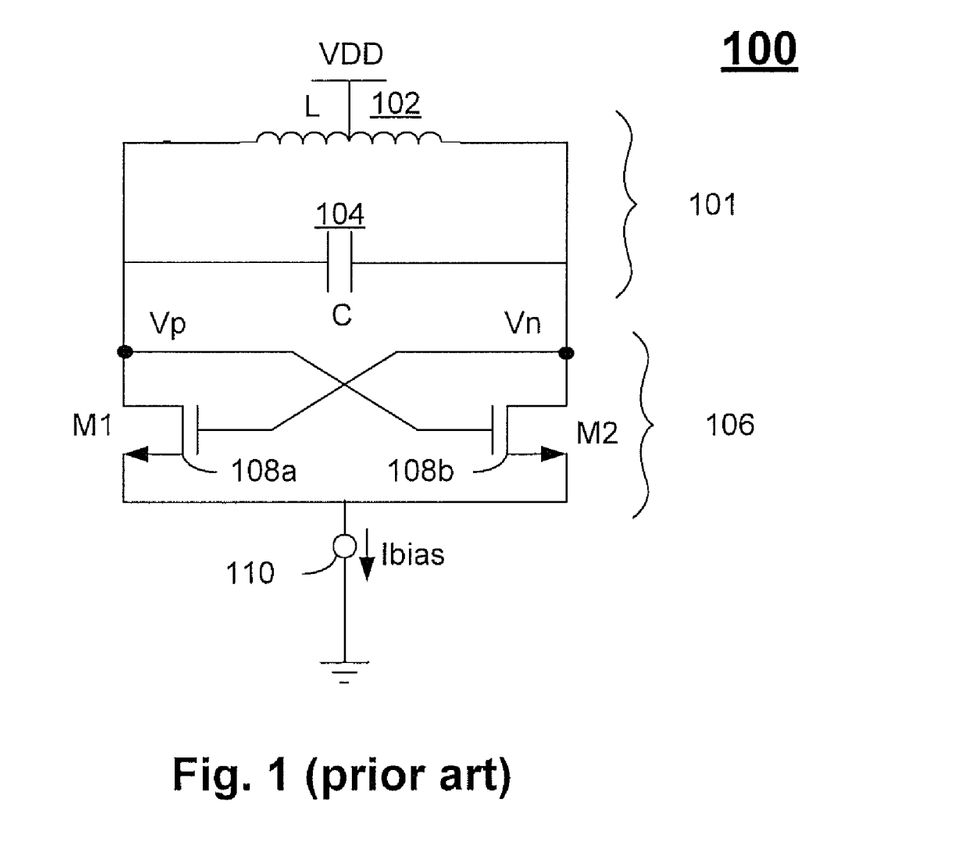
FIG. 1 depicts a conventional voltage controlled oscillator.

FIG. 1 depicts a conventional voltage controlled oscillator 100. An inductor/capacitor tank (LC tank) 101 is formed by a parallel or series connection of an inductor 102 and a capacitor 104. LC-tank 101 is coupled to an active circuit, which is represented as a cross-coupled transistor pair 106. As shown, cross-coupled transistor pair 106 is coupled in parallel to LC-tank 101 and includes a first transistor 108a (M1) and a second transistor 108b (M2).

In operation, for a resonant frequency, the impedance of LC-tank 100 becomes infinite and when energy is stored initially in the tank, it circulates from voltage energy in capacitor 104 to current energy in inductor 102, and vice versa. This exchange of energy occurs at the resonant frequency, with the voltage and current being sinusoidal in quadrature phase with respect to each other and the ratio of the voltage and current amplitude being:

$$V/I = \sqrt{LC}.$$

Reactive components, such as inductor 102 and capacitor 104, have losses in the real world implementation. The losses may be modeled as series or parallel resistances to LC-tank 100. The losses may dampen the oscillating signal generated by LC-tank 100. The active circuit may be used to compensate for the losses.

A negative resistance is synthesized by cross coupled transistor pair 106 and is explained by describing the currents sourced/sinked by cross-coupled transistor pair 106 to/away from LC-tank 101. The current sourced/sinked is biased by a current source (Ibias) 110. When a voltage at a node Vp is at its positive peak value, the resistance of LC-tank 101 is taking away current from node Vp. To compensate for this, transistor 108a is sourcing current into node Vp. When the voltage at node Vp is at its negative peak value, the resistance of LC-tank 101 is sourcing current into node Vp and transistor 108a is sinking current from node Vp. The dual behavior happens at node Vn.

Cross-coupled transistor pair 106 is behaving as a negative resistance because cross-coupled transistor pair 106 is sourcing current from nodes Vp or Vn when the voltage is at a maximum at the nodes and sinking current from nodes Vp or Vn when the voltage is at a minimum at the nodes. The ratio between the voltage at nodes Vp or Vn to the current flowing out of nodes Vp or Vn is negative. Synthesizing the negative resistance sustains the oscillation at a desired frequency.

VCO 100 may be used in a radio frequency (RF) transceiver. VCO 100 offers advantages in that it is simple and offers relatively good performance. However, in some more advanced RF applications, voltage controlled oscillators with a better phase noise (higher purity) may be required. Typically, VCO 100 may be run with a higher current or through the use of an external inductor with a higher quality factor (Q).

The above solutions may reduce phase noise, but still inject current (energy) alternatingly to one side of VCO 100 to replenish the energy loss of LC-tank 101. The current energy injected into LC-tank 101 alternates essentially around the time when the oscillating signal changes polarity or crosses a middle point. Injecting current causes transistors 108a and 108b to alternatingly be on during the zero crossing point of the oscillating signal. While this will maintain the oscillation of VCO 100, some RF designs may still require VCOs with a better phase noise.

SUMMARY

In one embodiment, an apparatus includes a tank circuit of a voltage controlled oscillator (VCO). A pair of transistors each have a gate, drain, and a source. The drains of the pair of transistors are coupled to the tank circuit. A pair of alternating current (AC) coupling capacitors couple the gates of the pair of transistors to the drains of the pair of transistors. A bias circuit is coupled to the gates of the pair of transistors to bias the pair of transistors such that the pair of transistors alternatingly turn on during a plurality of peaks of an oscillating signal of the tank circuit and the pair of transistors turn off during a plurality of crossing points of the oscillating signal. A feedback loop is configured to detect a peak oscillating amplitude of the oscillating signal and adjust a bias voltage of the bias circuit.

In another embodiment, an apparatus includes a tank circuit of a voltage controlled oscillator (VCO). A pair of transistors each have a gate, drain, and a source. The drains of the pair of transistors are coupled to the tank circuit. A pair of alternating current (AC) coupling capacitors couple the gates of the pair of transistors to the drains of the pair of transistors. A bias circuit is coupled to the gates of the pair of transistors to bias the pair of transistors such that the pair of transistors alternatingly turn on during a plurality of peaks of an oscillating signal of the tank circuit and the pair of transistors turn off during a plurality of crossing points of the oscillating signal. A supply capacitor is coupled to the tank circuit and to the pair of transistors to provide an instantaneous current to the VCO.

In one embodiment, a method is provided comprising: generating an oscillating signal using a tank circuit of a voltage controlled oscillator (VCO); alternatingly turning on a pair of transistors during a plurality of peaks of the oscillating signal of the tank circuit, wherein the pair of transistors are biased to alternatingly turn on during the plurality of peaks of the oscillating signal; turning off the pair of transistors during a plurality of crossing points of the oscillating signal, wherein the pair of transistors are biased to turn off during the plurality of crossing points of the oscillating signal; and providing an instantaneous current to the VCO when the pair of transistors are alternatingly turned on.

In one embodiment, a method is provided comprising: generating an oscillating signal using a tank circuit of a voltage controlled oscillator (VCO); alternatingly turning on a pair of transistors during a plurality of peaks of the oscillating signal of the tank circuit, wherein the pair of transistors are biased to alternatingly turn on during the plurality of peaks of the oscillating signal; turning off the pair of transistors during a plurality of crossing points of the oscillating signal, wherein the pair of transistors are biased to turn off during the plurality of crossing points of the oscillating signal; and detecting a peak oscillating amplitude of the oscillating signal; and adjusting a bias voltage of the pair of transistors based on the peak oscillating amplitude detected.

The following detailed description and accompanying drawings provide a better understanding of the nature and advantages of the present invention.

DETAILED DESCRIPTION

Described herein are techniques for a voltage controlled oscillator (VCO). In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 2:
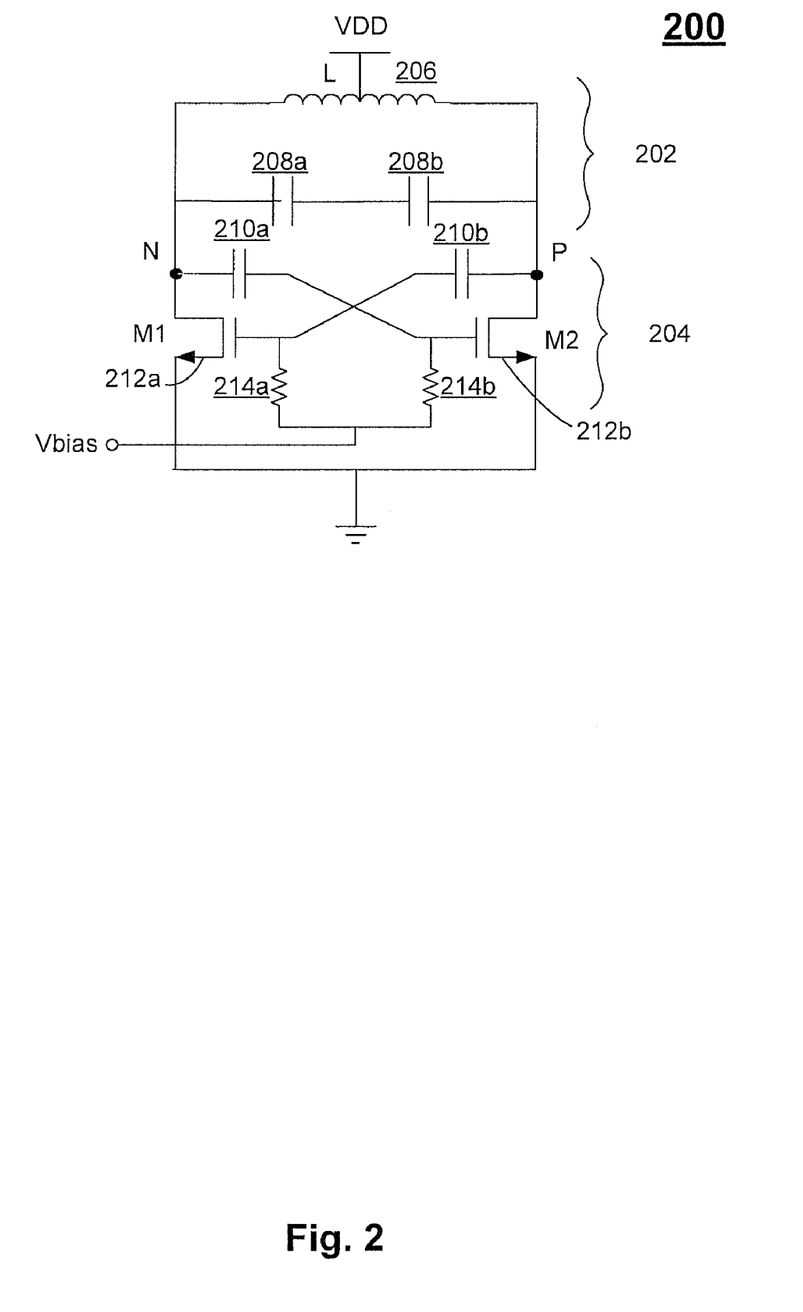
FIG. 2 depicts an example of a voltage controlled oscillator according to one embodiment.

FIG. 2 depicts an example of a voltage controlled oscillator according to one embodiment. Voltage controlled oscillator 200 includes an inductor-capacitor (LC) tank 202 and a cross-coupled pair of transistors 204. LC tank 202 includes an inductor 206 and capacitors 208a and 208b. Other examples of a tank circuit may be used. A current source (not shown) may be used to provide a bias current.

Cross-coupled pair of transistors 204 includes a first transistor 212a (M1) and a second transistor 212b (M2). Transistors M1 and M2 may be N-channel metal oxide semiconductor field effect transistors (MOSFETs) but may also be implemented using other components, such as P-channel MOSFETs. Transistors M1 and M2 each have a gate cross-coupled with the drain of the other transistor. Also, the drains of transistors M1 and M2 are each coupled to LC tank 202. Cross-coupled transistor pair 204 provides a negative resistance by sourcing/sinking current into/out of LC tank 202.

Particular embodiments bias transistors M1 and M2 to normally be off, but to turn on alternatingly around peaks of an oscillating signal of LC-tank 202. When transistors M1 and M2 are turned on, current (energy) is injected into LC-tank 202 to keep an oscillating signal oscillating indefinitely. Transistors M1 and M2 are also off when the oscillating signal changes polarity at a crossing point (e.g., a zero crossing or middle point). This results in LC-tank 202 operating in an efficient state and provides a low power VCO design.

In one embodiment, a pair of alternating current (AC) coupling capacitors 210a and 210b couple the gates of cross-coupled transistor pair 204 to nodes N or P. For example, AC coupling capacitor 210a couples the gate of transistor M2 to node N and AC coupling capacitor 210b couples the gate of transistor M1 to node P. AC coupling capacitors 210a and 210b block a direct current (DC) component of an oscillating signal at nodes N and P. This allows a DC bias to be applied to the gates of transistors M1 and M2.

A bias circuit is used to apply the DC bias voltage to bias transistors M1 and M2. Different implementations of bias circuits may be used. In one example, resistors 214a and 214b are coupled to a voltage source Vbias. Resistor 214a is coupled to the gate of transistor M1 and resistor 214b is coupled to the gate of transistor M2. The bias circuit biases transistors M1 and M2 to be normally off and then turn on for a short period of time. That is, the voltage Vbias is set to bias transistors M1 and M2 to alternatingly turn on during a peak of the oscillating signal of LC-tank 202. This is accomplished by biasing transistors M1 and M2 below the transistors' threshold voltage.

Figure 3A:
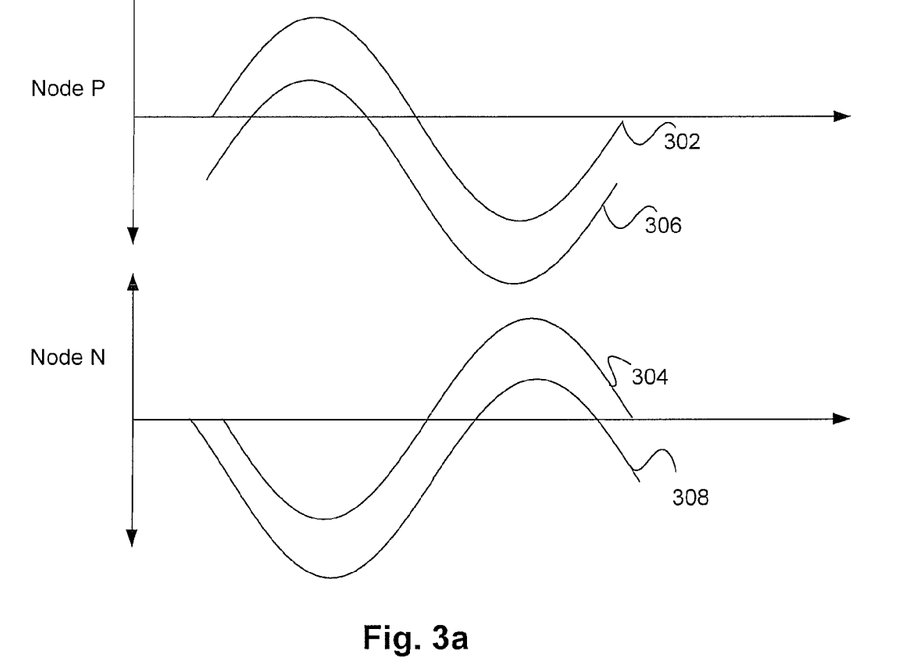
FIGS. 3a-3b depict waveforms for the operation of the VCO according to one embodiment.
Figure 3B:
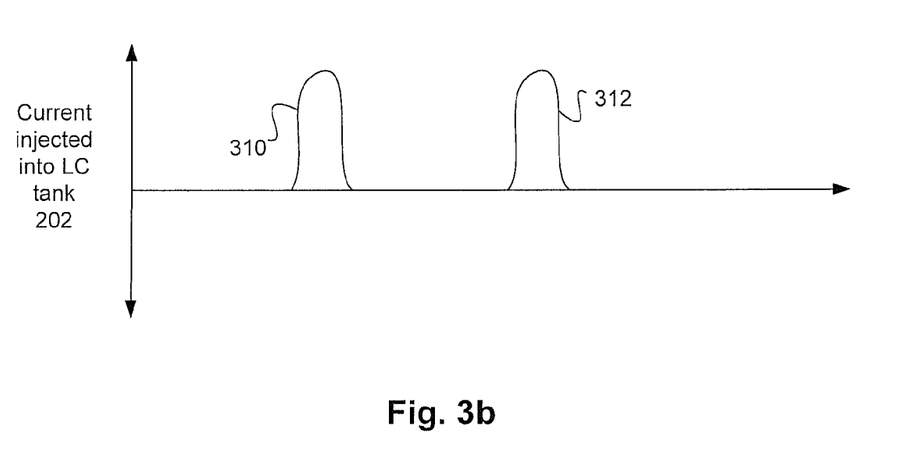

FIGS. 3a-3b depict waveforms for the operation of VCO 200 according to one embodiment. FIG. 3a shows voltage waveforms for the oscillating signal at node N and node P and voltage waveforms for signals being input into the gates of transistors M1 and M2. FIG. 3b shows a waveform for the current injected into LC-tank 202.

In FIG. 3a, a voltage waveform 302 is shown for node P and a voltage waveform 304 is shown for node N. Waveforms 302 and 304 represent the oscillating signal of LC tank 202. Particular embodiments move the DC bias of waveforms 302 and 304 down to cause transistors M1 and M2 to turn on momentarily during the peak of waveforms 302 and 304. For example, a waveform 306 shows the signal that is input into transistor M1 and a waveform 308 shows the signal that is input into transistor M2. As shown, waveforms 306 and 308 have been moved down. This results in a shorter time that the voltage at the gates of M1 and M2 are above the threshold voltages of transistors M1 and M2 to turn transistors M1 and M2 on.

When waveform 306 goes above the threshold voltage of transistor M1, transistor M1 turns on. This causes a spike in current, which is shown in FIG. 3b at 310. Also, when waveform 308 goes above the threshold voltage of transistor M2, this causes a spike in current, which is shown in FIG. 3b at 312. As can be seen, the spike in current occurs around the peak of waveforms 302 or 304. Thus, transistors M1 and M2 alternatingly turn on during the peaks of the oscillating signal. For example, during a positive peak of oscillating signal 302 at node P (or the negative peak of waveform 304 at node N), transistor M1 is on and transistor M2 is off. During the zero crossing of waveforms 302 and 304, transistors M1 and M2 are off. Then, during the positive peak of waveform 304 at node N (or the negative peak of waveform 302 at node P), transistor M2 is on and transistor M1 is off. This provides an injection of current to maintain the oscillation of the oscillating signal while limiting phase noise.

Because transistors M1 and M2 may be normally biased to be off, particular embodiments may use a start-up condition to initiate VCO 200 with a large enough voltage swing such that transistors M1 and M2 turn on during the peaks of the oscillating signal. Different methods may be used to provide the start-up condition.

Figure 4:
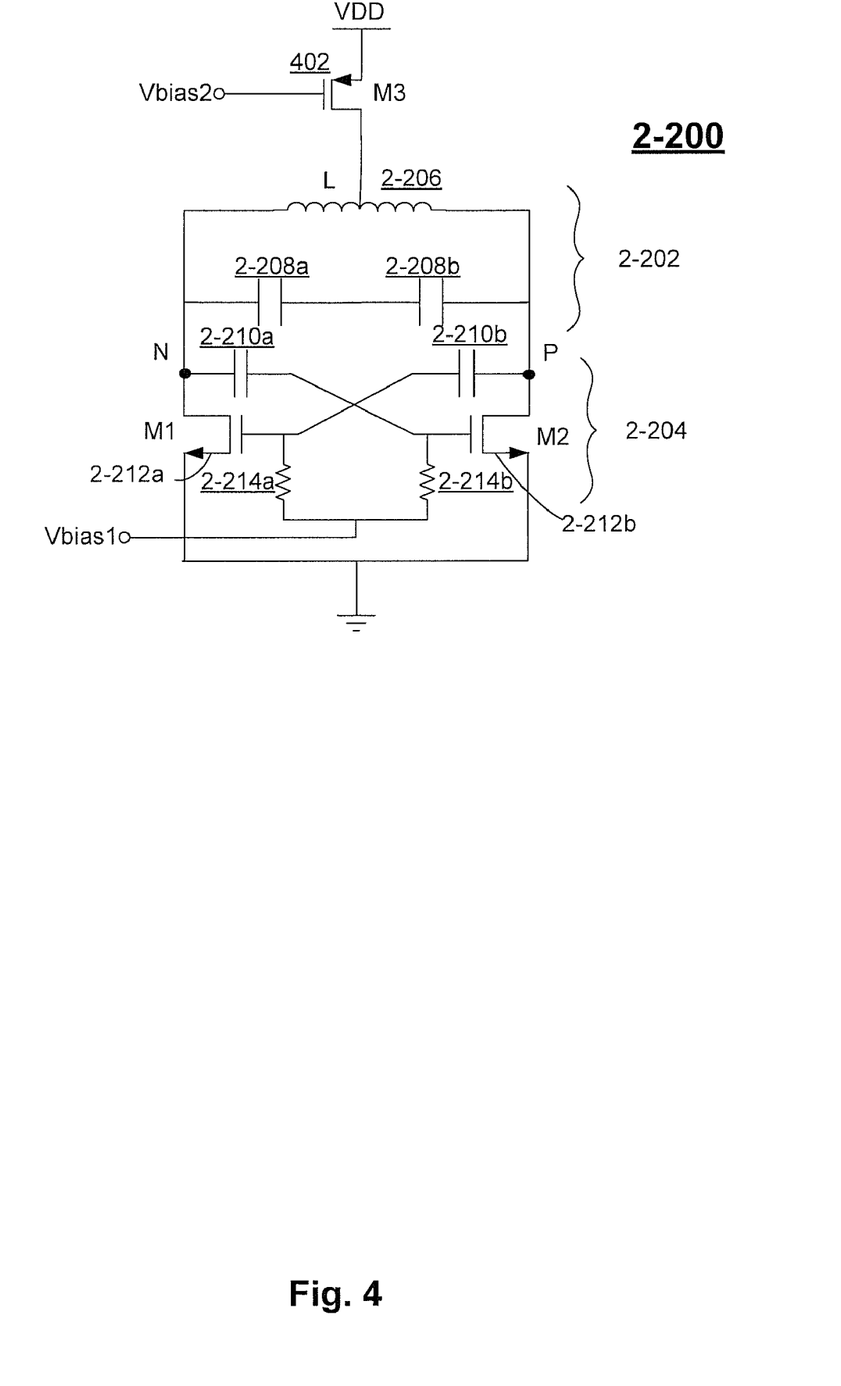
FIG. 4 depicts another example of the VCO according to one embodiment
Figure 5:
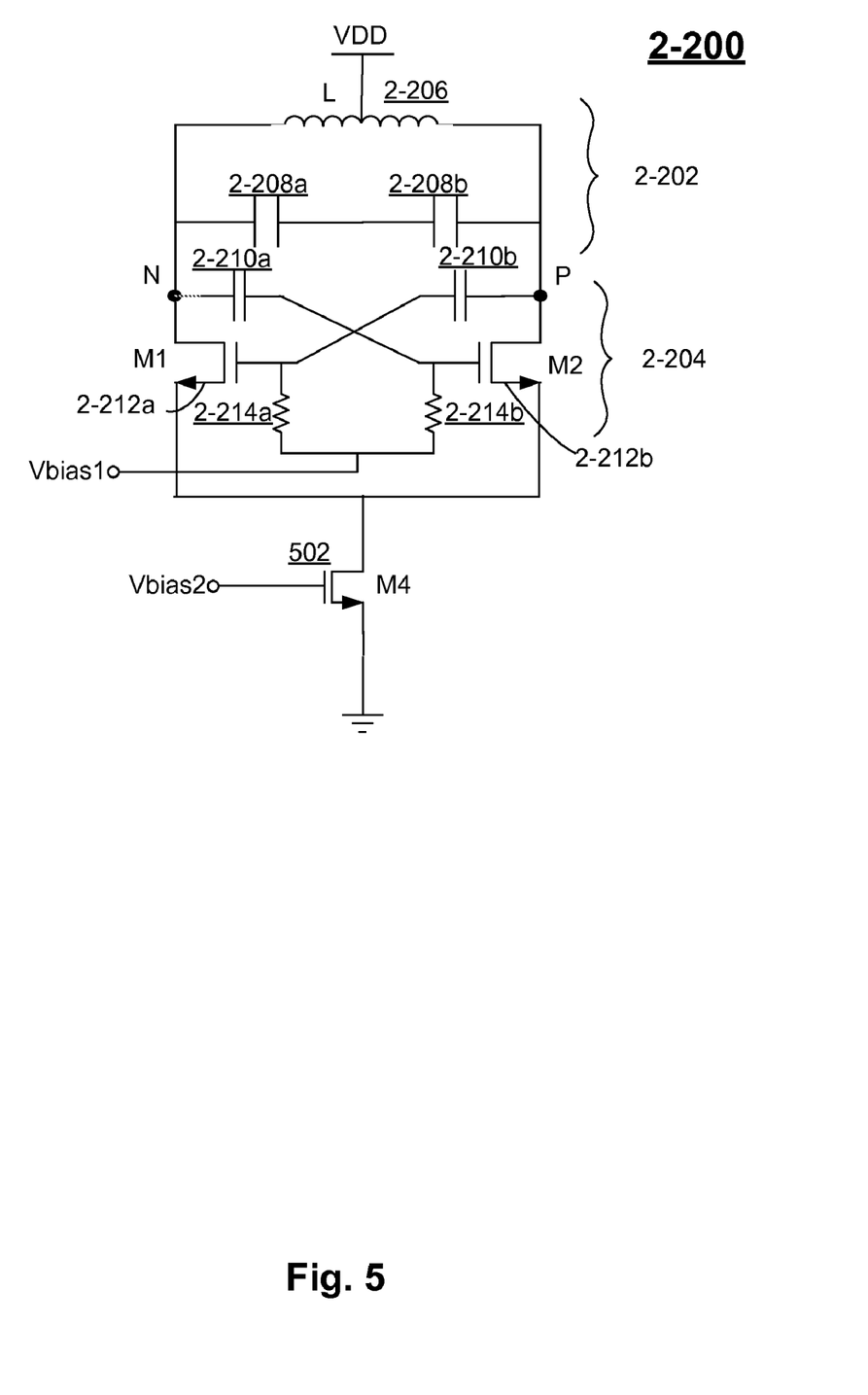
FIG. 5 depicts another example of the VCO according to one embodiment.

Different implementations of VCO 200 may be provided. For example, FIGS. 4 and 5 depict different implementations of VCO 200. Although these implementations are shown, it will be understood that other implementations may be appreciated.

FIG. 4 depicts another example of VCO 2-200 according to one embodiment. VCO 2-200 includes a transistor 402 (M3). Transistor M3 is coupled between a power supply VDD and inductor 2-206. Also, a voltage source provides a voltage Vbias2. Transistor M3 may provide a bias current. The operation of VCO 2-200 is similar to the operation of VCO 200 described in FIG. 2.

FIG. 5 depicts another example of VCO 2-200 according to one embodiment. A transistor 502 (M4) has been added to VCO 2-200. Transistor M4 is coupled to the sources of transistors M1 and M2. A voltage source provides a voltage Vbias2 into the gate of transistor M4. Transistor M4 may provide an optional bias current which allows better current control during start-up operation. The operation of VCO 2-200 is similar to the operation of VCO 200 described in FIG. 2. Other implementations of VCO 2-200 may also be used.

Turning on transistors M1 and M2 around the peak of oscillation periods of the oscillating signal may result in peaky current through the power supply VDD. This current has a fundamental frequency that is twice the oscillation frequency of LC-tank 202. Particular embodiments may suppress the potential radiation of this energy through a packaging inductance of a device including VCO 200 by using a capacitor coupled to the center tap of inductor 206 and to the sources of transistors M1 and M2.

Figure 6:
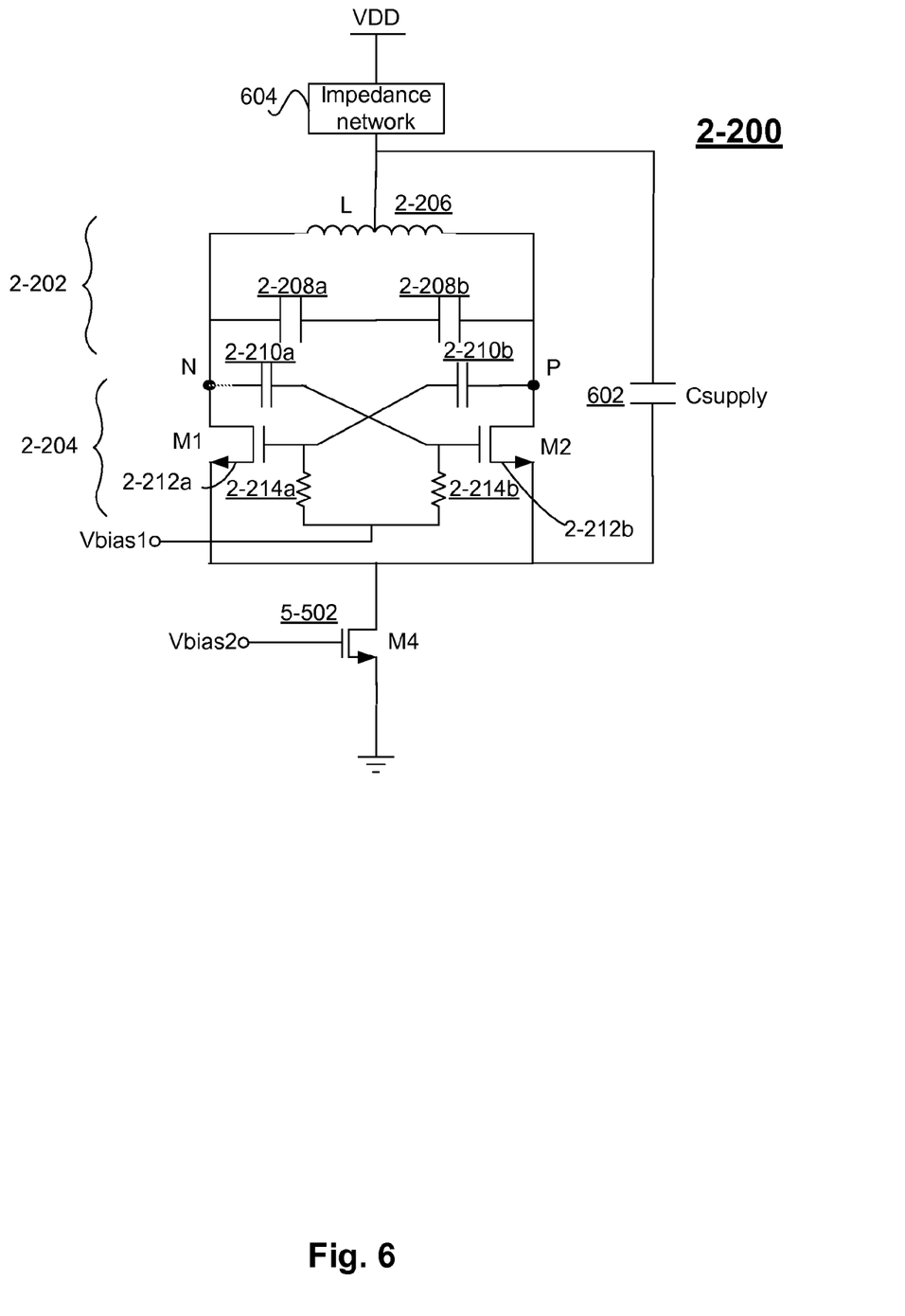
FIG. 6 depicts an example of a VCO that includes a capacitor (Csupply) according to one embodiment.

FIG. 6 depicts an example of VCO 2-200 that includes a capacitor 602 (Csupply) according to one embodiment. Capacitor 602 is coupled to inductor 2-206 at a tap point, such as a center tap point to inductor 2-206. Also, capacitor 602 is coupled to the sources of transistors M1 and M2.

Capacitor 602 provides an instantaneous current that may be needed by VCO 2-200. For example, when transistors M1 or M2 turn on, the current may spike as shown in FIG. 3b. It may not be possible to supply the instantaneous current using the power supply VDD. Accordingly, capacitor 602 may be used to supply some of the instantaneous current that is needed. For example, when one of transistors M1 or M2 turns on, current may be supplied via the power supply VDD and also from capacitor 602.

Figure 7:
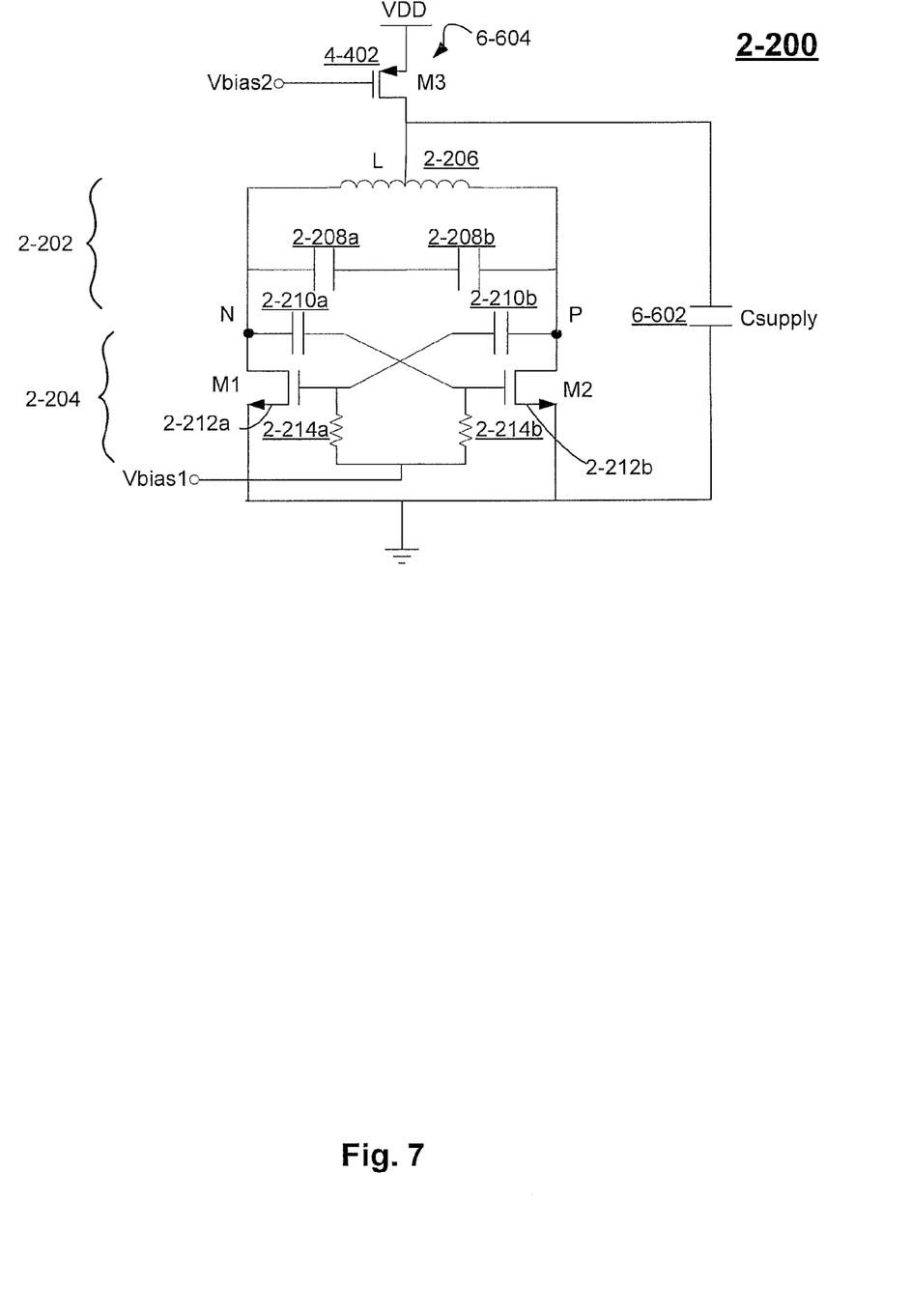
FIG. 7 depicts an example of the VCO of FIG. 6 with an example impedance network according to one embodiment.

A series impedance network 604 may also be added in between the tap to inductor 2-206 and the power supply VDD. Impedance network 602 may be used to choke off the spike in current such that it does not reach the power supply VDD. The impedance network may also be implemented differently, such as using any choke, an active voltage regulator, or an active current source. For example, FIG. 7 shows an example of impedance network 6-604 according to one embodiment. Transistor 4-402 provides an impedance between the tap to inductor 2-206 and the power supply VDD.

Figure 8:
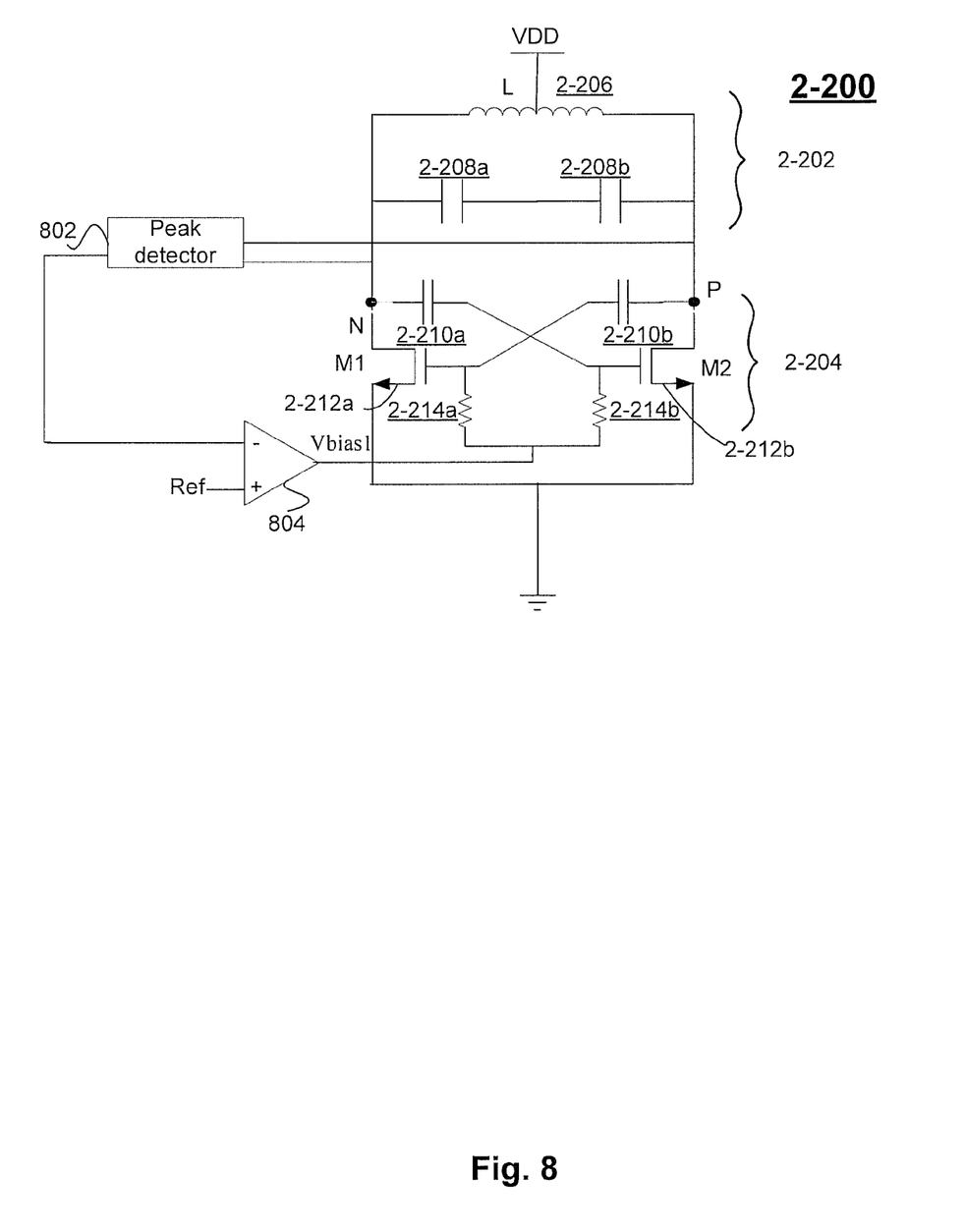
FIG. 8 depicts an example of a VCO for tracking the process and temperature variations of the die according to one embodiment.

In a real world implementation, the bias voltage for transistors M1 and M2 tracks the process and temperature variations of a die including VCO 200. FIG. 8 depicts an example of VCO 2-200 that may cause transistors M1 and M2 to track the processing temperature variations of the die according to one embodiment. A feedback loop is provided to adjust the DC bias voltage Vbias1. In one embodiment, the feedback loop includes a peak detector 802 and an op amp 804. Although peak detector 802 and op amp 804 are described, other feedback loops may be used to adjust the DC bias voltage Vbias1.

Peak detector 802 is coupled to nodes P and N. Peak detector 802 detects the peak oscillation amplitude of the oscillating signal at nodes P and N. For example, the peak oscillating amplitude is determined by comparing a first peak oscillating amplitude at node P and a second peak oscillating amplitude at node N. The peak oscillating amplitude is the largest oscillating amplitude out of the first peak oscillating amplitude and the second peak oscillating amplitude.

The peak oscillation amplitude is then input into op amp 804 along with a reference. Op amp 804 may be a comparator that compares the peak oscillation amplitude with the reference and outputs a DC bias voltage Vbias1. The DC bias voltage Vbias1 is adjusted by the feedback loop such that eventually the DC bias voltage Vbias1 settles to the reference. This allows the DC bias voltage Vbias1 to be independent of any variations due to temperature or process. Also, the amplitude of the voltage at nodes N and P is maximized for a given overall power budget.

Figure 9:
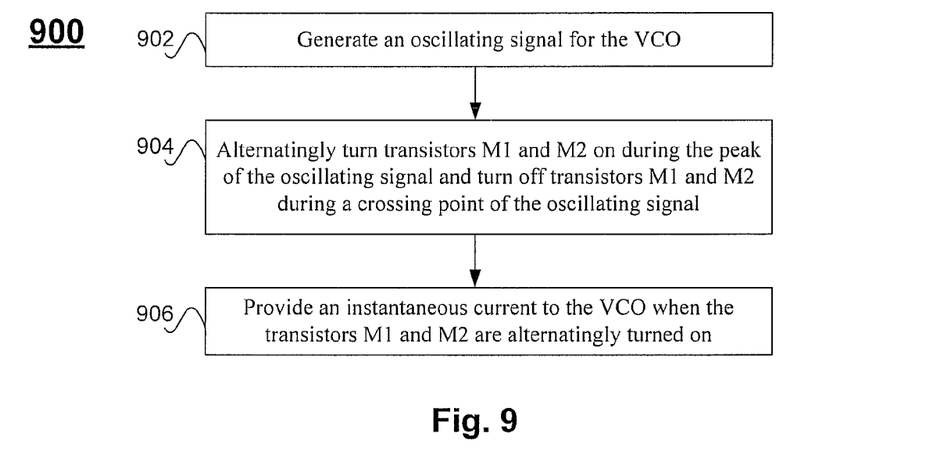
FIG. 9 depicts a simplified flowchart describing the operation of the VCO for FIGS. 6 and 7 according to one embodiment.

FIG. 9 depicts a simplified flowchart 900 describing the operation of VCO 2-200 for FIGS. 6 and 7 according to one embodiment. At 902, LC-tank 202 generates an oscillating signal for VCO 200. At 904, transistors M1 and M2 are alternatingly turned on during the peak of the oscillating signal and turned off during a crossing point of the oscillating signal. A bias circuit is used to turn on transistors M1 and M2 during the peak of the oscillating signal and turn off during the crossing point of the oscillating signal. At 906, an instantaneous current is provided to VCO 2-200 when the transistors M1 and M2 are alternatingly turned on.

Figure 10:
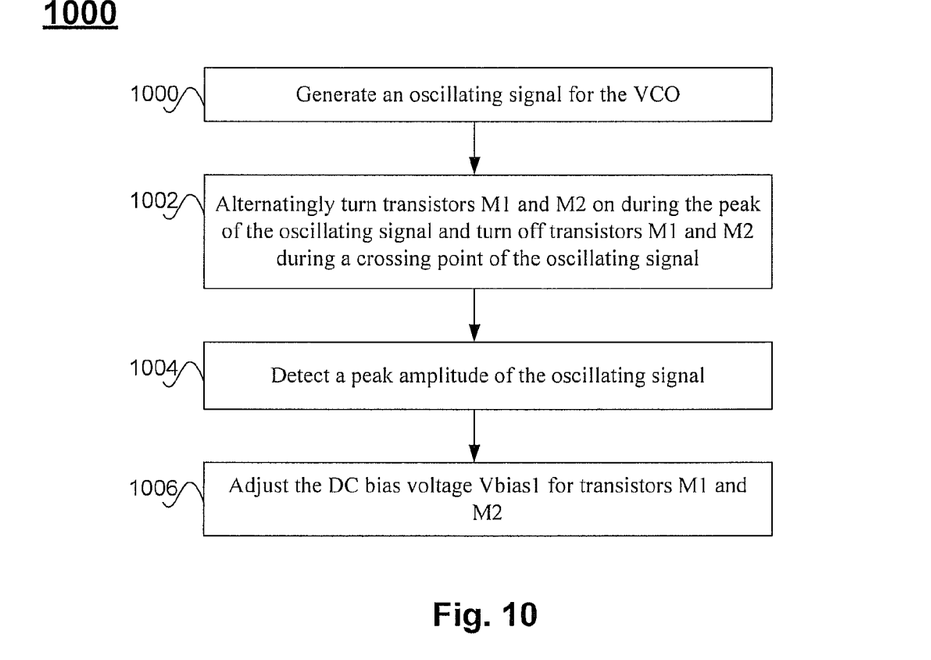
FIG. 10 depicts a simplified flowchart describing the operation of the VCO as shown in FIG. 8 according to one embodiment.

FIG. 10 depicts a simplified flowchart 1000 describing the operation of VCO 2-200 as shown in FIG. 8 according to one embodiment. At 1002, LC-tank 202 generates an oscillating signal for VCO 200. At 1004, transistors M1 and M2 are alternatingly turned on during the peak of the oscillating signal and turned off during a crossing point of the oscillating signal.

At 1006, peak detector 802 detects a peak oscillating amplitude of the oscillating signal. For example, the peak oscillating amplitude is detected from nodes N and P. At 1008, the DC bias voltage Vbias1 is then adjusted for transistors M1 and M2 based on the peak oscillating amplitude.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:
1. An apparatus comprising:
   a tank circuit of a voltage controlled oscillator (VCO);
   a pair of transistors each having a gate, drain, and a source, wherein the drains of the pair of transistors are coupled to the tank circuit;

a pair of alternating current (AC) coupling capacitors, wherein the pair of AC coupling capacitors couple the gates of the pair of transistors to the drains of the pair of transistors;

a bias circuit coupled to the gates of the pair of transistors to bias the pair of transistors such that the pair of transistors alternatingly turn on during a plurality of peaks of an oscillating signal of the tank circuit and the pair of transistors turn off during a plurality of crossing points of the oscillating signal, wherein a first instantaneous current is provided to the VCO by a power supply coupled to the VCO;

a current source coupled to the pair of transistors to provide a bias current for the VCO; and a supply capacitor coupled to a first node of the tank circuit and to a second node in between each of the pair of transistors and the current source to provide a second instantaneous current to supplement the first instantaneous current being supplied by the power supply when one of the pair of transistors is turned on.

2. The apparatus of claim 1, wherein the tank circuit comprises:
an inductor including the first node,
wherein the supply capacitor is coupled to the first node of the inductor and each of the pair of transistors.

3. The apparatus of claim 1, further comprising an impedance network coupled to the first node and to a power supply.

4. The apparatus of claim 1, wherein the second instantaneous current is supplied to the VCO during a time when one of the pair of transistors is on.

5. The apparatus of claim 1, wherein the plurality of peaks comprise a first peak of the oscillating signal at a third node of the tank circuit and a second peak of the oscillating signal at a fourth node of the tank circuit.

6. The apparatus of claim 1, wherein the bias circuit is configured to bias the pair of transistors below a threshold voltage for each of the pair of transistors.

7. The apparatus of claim 1, further comprising a feedback loop configured to detect a peak oscillating amplitude of the oscillating signal and adjust a bias voltage of the bias circuit.

8. The apparatus of claim 1, wherein:
the current source comprises a transistor, and
the supply capacitor is coupled in between a first terminal of each of the pair of transistors and a second terminal of the transistor.

9. A method comprising:
generating an oscillating signal using a tank circuit of a voltage controlled oscillator (VCO);
providing a bias current for the VCO via a current source coupled to a pair of transistors;
alternatingly turning on a pair of transistors during a plurality of peaks of the oscillating signal of the tank circuit, wherein the pair of transistors are biased to alternatingly turn on during the plurality of peaks of the oscillating signal;
turning off the pair of transistors during a plurality of crossing points of the oscillating signal, wherein the pair of transistors are biased to turn off during the plurality of crossing points of the oscillating signal;
providing a first instantaneous current to the VCO when the pair of transistors are alternatingly turned on via a power supply coupled to the VCO; and
providing a second instantaneous current to supplement the first instantaneous current being supplied by the power supply when one of the pair of transistors is turned on, the second instantaneous current provided via a supply capacitor coupled to a first node of the tank circuit and to a second node in between each of the pair of transistors and the current source.

10. The method of claim 9, wherein the plurality of peaks comprise a first peak of the oscillating signal at a third node of the tank circuit and a second peak of the oscillating signal at a fourth node of the tank circuit.

11. The method of claim 9, wherein the pair of transistors are biased below a threshold voltage for each of the pair of transistors.

12. The method of claim 9, further comprising:
detecting a peak oscillating amplitude of the oscillating signal; and
adjusting a bias voltage.

13. The method of claim 9, wherein:
the current source comprises a transistor, and
the supply capacitor is coupled in between a first terminal of each of the pair of transistors and a second terminal of the transistor.

* * * * *